United States Patent
Ko et al.

(10) Patent No.: US 9,321,074 B2
(45) Date of Patent: Apr. 26, 2016

(54) METHOD OF MANUFACTURING A MASK FRAME ASSEMBLY FOR THIN FILM DEPOSITION

(71) Applicants: Jung-Woo Ko, Yongin (KR); Sang-Shin Lee, Yongin (KR); Taek-Kyo Kang, Yongin (KR); Seung-Ju Hong, Yongin (KR)

(72) Inventors: Jung-Woo Ko, Yongin (KR); Sang-Shin Lee, Yongin (KR); Taek-Kyo Kang, Yongin (KR); Seung-Ju Hong, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 602 days.

(21) Appl. No.: 13/850,915

(22) Filed: Mar. 26, 2013

(65) Prior Publication Data

US 2013/0205568 A1  Aug. 15, 2013

Related U.S. Application Data

(62) Division of application No. 12/591,591, filed on Nov. 24, 2009, now Pat. No. 8,402,917.

(30) Foreign Application Priority Data

Apr. 16, 2009 (KR) .................. 10-2009-0033191

(51) Int. Cl.
*B05C 11/00* (2006.01)
*H01L 51/56* (2006.01)
*C23C 14/04* (2006.01)
*H01L 51/00* (2006.01)

(52) U.S. Cl.
CPC .............. *B05C 11/00* (2013.01); *C23C 14/042* (2013.01); *H01L 51/0011* (2013.01); *H01L 51/56* (2013.01); *Y10T 29/49826* (2015.01); *Y10T 29/49885* (2015.01); *Y10T 156/10* (2015.01)

(58) Field of Classification Search
CPC ........ B05C 11/00; C25D 17/04; H01L 51/56; C23C 14/042
See application file for complete search history.

(56) References Cited

U.S. PATENT DOCUMENTS

| 4,082,144 | A  | 4/1978  | Marquis |
| 4,409,924 | A  | 10/1983 | Laverty et al. |
| 5,001,299 | A  | 3/1991  | Hingorany |
| 5,933,330 | A  | 8/1999  | Beutler et al. |
| 6,659,659 | B1 | 12/2003 | Malone |

(Continued)

FOREIGN PATENT DOCUMENTS

| JP | 2003-332057      | 11/2003 |
| JP | 2004-014513 A    | 1/2004  |
| JP | 2005-350712      | 12/2005 |
| KR | 10-2003-0093959 A | 12/2003 |
| KR | 10-2008-0048653 A | 6/2008  |

OTHER PUBLICATIONS

English Translation—KR 10-2006-0118879, Bae, (Jun. 3, 2008).

*Primary Examiner* — Bryan D. Ripa
(74) *Attorney, Agent, or Firm* — Lee & Morse, P.C.

(57) ABSTRACT

A mask frame assembly for thin film deposition including a frame having an opening portion and a support portion, and a mask having a deposition area in a position corresponding to the opening portion, wherein the mask includes a first layer including the deposition area and a peripheral portion disposed outside the deposition area and a second layer including a first surface and a second surface opposite to the first surface, at least a part of the first surface of the second layer faces the first layer and contacts the peripheral portion, and the second surface is welded to the support portion of the frame.

9 Claims, 20 Drawing Sheets

(56) References Cited

U.S. PATENT DOCUMENTS

| | | | |
|---|---|---|---|
| 6,926,840 B2 * | 8/2005 | Clark | C23C 14/042 216/12 |
| 7,003,874 B1 | 2/2006 | Farnworth et al. | |
| 2003/0201711 A1 * | 10/2003 | Abiko | C23C 14/042 313/504 |
| 2003/0221614 A1 * | 12/2003 | Kang | C23C 14/042 118/504 |
| 2004/0020435 A1 | 2/2004 | Tsuchiya et al. | |
| 2006/0012290 A1 * | 1/2006 | Kang | C23C 14/042 313/504 |
| 2006/0103289 A1 * | 5/2006 | Kim | B05B 15/045 313/402 |
| 2008/0014822 A1 | 1/2008 | Yamazaki et al. | |

* cited by examiner (a)

(b)

(c)

(d)

(a)

(b)

(c)

(d)

METHOD OF MANUFACTURING A MASK FRAME ASSEMBLY FOR THIN FILM DEPOSITION

CROSS REFERENCE TO RELATED APPLICATION

This is a divisional application based on pending application Ser. No. 12/591,591, filed Nov. 24, 2009, the entire contents of which is hereby incorporated by reference.

BACKGROUND

1. Field

Embodiments relate to a mask frame assembly for thin film deposition and associated methods.

2. Description of the Related Art

Depending on the material of a light emitting layer, electroluminescent display devices may be classified into inorganic electroluminescent devices and organic electroluminescent display devices. Since organic electroluminescent display devices may have higher brightness and faster response time than inorganic electroluminescent display devices and may also be capable of displaying color images, there have been considerable developments recently in the field of organic electroluminescent display devices.

In general, organic light emitting display devices, which are a type of flat panel display devices, are self-emissive display devices. Organic light emitting display devices have attracted much attention as the next-generation of display devices because of their, e.g., wide viewing angle, high contrast, low driving voltage, light weight, thin profile, and fast response time.

Regarding the manufacture of organic light emitting display devices, an organic layer and/or an electrode may be formed using, e.g., a vacuum deposition method. A mask used in the vacuum deposition method may be manufactured using, e.g., an etching method. However, as organic light emitting display devices have developed higher resolution, apertures in the mask may have a narrower width and smaller distribution. Thus, when the etching method is used, since the width of the apertures formed in the mask may be determined by the thickness of a material the mask is formed of, a thinner material may be required in order to manufacture a mask suitable for making higher resolution products.

SUMMARY

Embodiments are directed to a mask frame assembly for thin film deposition and associated methods, which substantially overcome one or more of the drawbacks, limitations and/or disadvantages of the related art.

It is a feature of an embodiment to provide a mask frame assembly for thin film deposition that allows for easy welding to a frame.

At least one of the above and other features and advantages may be realized by providing a mask frame assembly for thin film deposition including a frame including an opening portion and a support portion, and a mask including a deposition area in a position corresponding to the opening portion, wherein the mask includes a first layer including the deposition area and a peripheral portion disposed outside the deposition area and a second layer including a first surface and a second surface opposite to the first surface, at least a part of the first surface of the second layer faces the first layer and contacts the peripheral portion, and the second surface is welded to the support portion of the frame.

The mask may include at least two unit mask strips, each unit mask strip having opposing ends, and only the opposing ends of the at least two unit mask strips being integral with the support portion of the frame.

The first layer and the second layer may include different materials.

The second layer may include a nickel-steel alloy.

The first layer may include welding patterns corresponding to welding points on the second layer where the second layer is welded to the support portion of the frame.

The second layer may further include first welding projections on the first surface, the welding patterns may have ends, the first welding projections may have centers, and the centers of the first welding projections may be spaced apart from the ends of the welding patterns.

At least a part of the first layer may contact the second layer.

The second layer may further include second welding projections, the second welding projections may have centers, and the centers of the second welding projections may be spaced apart from the first layer.

The first layer and the second layer may be integral with each other.

The mask may further include an adhesive layer disposed between the first layer and the second layer.

At least one of the above and other features and advantages may also be realized by providing a method of manufacturing an organic light emitting display device including forming a first electrode and a second electrode on a substrate such that the first electrode and the second electrode face each other, and forming an organic layer between the first electrode and the second electrode, wherein forming the organic layer or the second electrode includes depositing the layer using a mask frame assembly for thin film deposition of an embodiment.

At least one of the above and other features and advantages may also be realized by providing a method of manufacturing a mask frame assembly for thin film deposition including preparing a frame such that the frame includes an opening portion and a support portion, and preparing a mask such that that the mask includes a first layer including a deposition area in a position corresponding to the opening portion and a peripheral portion disposed outside the deposition area, and a second layer including a first surface and a second surface opposite to each other, wherein at least a part of the first surface of the second layer contacts the peripheral portion of the first layer and the second surface of the second layer is welded to the support portion of the frame.

The mask may include at least two unit mask strips, each unit mask strip may have opposite ends, and only the opposite ends of the unit mask strips may be welded to the support portion of the frame.

Preparing the mask may include preparing a conductive substrate, disposing the second layer on the conductive substrate such that that at least a part of an end of the conductive substrate contacts the second layer, applying resists to the conductive substrate and the second layer, patterning the resists, forming the first layer on the conductive substrate, the resists, and the second layer by an electroplating method, removing the resists, and separating the mask including the first layer and the second layer from the conductive substrate.

Patterning the resists may include forming first patterns on the conductive substrate and forming second patterns on the second layer.

Patterning the resists may include forming first patterns on the conductive substrate and forming third patterns on a periphery of the second layer, and at least a part of the first layer may contact the second layer.

Preparing the mask may include preparing the first layer, preparing the second layer, and adhering the first layer to the second layer.

Adhering the first layer to the second layer may include preparing an adhesive layer, and disposing the adhesive layer between the first layer and the second layer.

The first layer and the second layer may include different materials.

The second layer may include a nickel-steel alloy.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
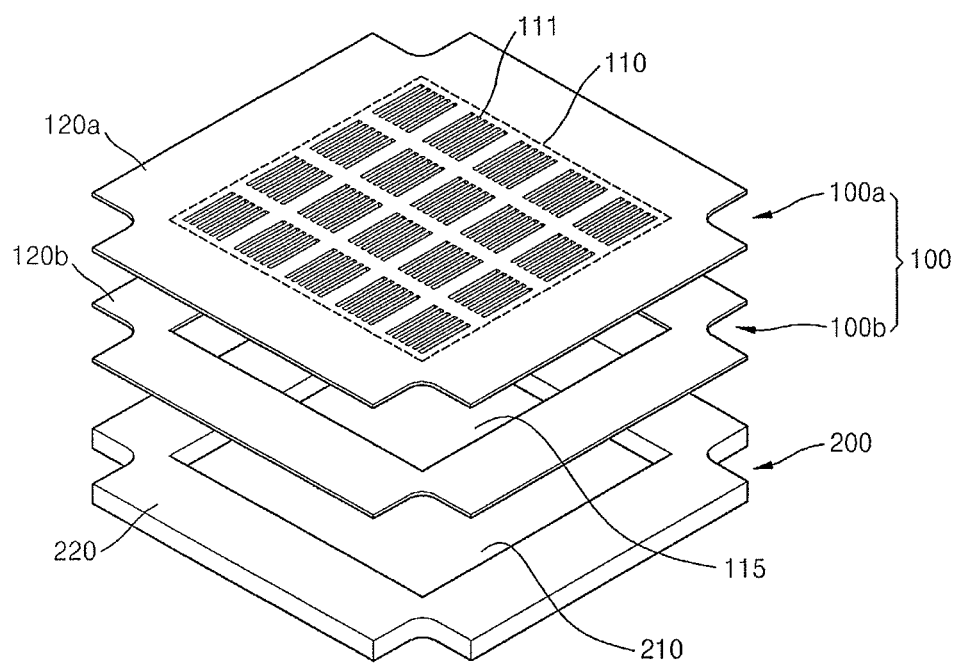
FIG. 1 illustrates an exploded perspective view of a mask frame assembly for thin film deposition, according to an embodiment.

Korean Patent Application No. 10-2009-0033191, filed on Apr. 16, 2009, in the Korean Intellectual Property Office, and entitled: "Mask Frame Assembly for Thin Film Deposition, Method of Manufacturing the Same, and Method of Manufacturing Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an exploded perspective view of a mask frame assembly for thin film deposition according to an embodiment. Referring to FIG. 1, the mask frame assembly may include a mask 100 and a frame 200.

The mask 100 may include a first layer 100a and a second layer 100b. The first layer 100a may include a deposition area 110, which may have a plurality of deposition opening portions 111 for forming, e.g., a plurality of organic light emitting display device patterns on a large area substrate (not shown) at once. The first layer 100a may also include a peripheral portion 120a disposed around the deposition area 110. The second layer 100b may include a welding portion 12b and an opening portion 115. The peripheral portion 120a may be disposed outside the deposition area 110 of the first layer 100a, and may contact the welding portion 120b of the second layer 100b.

Although each of the deposition opening portions 111 may include a masking pattern having a plurality of slits in FIG. 1, the deposition opening portions 111 may include a masking pattern having, e.g., an open front or a dot-shaped masking pattern. Thus, the number, configuration and shape of the deposition opening portions 111 in FIG. 1 are exemplary and the embodiments are not limited thereto.

A first surface of the second layer 100b may contact at least a part of the first layer 100a, and a second surface of the second layer 100b may be welded to a support portion 220 of the frame 200. The mask 100 may be formed by forming the first layer 100a and the second layer 100b and then fixing the first layer 100a to the second layer 100b by, e.g., welding, adhesion or insertion of an adhesive layer therebetween. Accordingly, the first layer 100a and the second layer 100b are shown separated in FIG. 1, and the first layer 100a and the second layer 100b may be formed separately and fixed together subsequently.

The first layer 100a and the second layer 100b may include different materials. Thus, the second layer 100b may include a material having higher weldability than the first layer 100a, e.g., a nickel-steel alloy (64FeNi, Invar).

To avoid deformations of the first layer 100a when the mask 100 is attached to the frame 200, the first layer 100a may have various shapes. Thus, only the second layer 100b may be welded to the frame 200. Accordingly, the same laser welding equipment may be used for welding the second layer 100b to the frame 200 irrespective of the shape of the first layer 100a. In addition, since the welding portion 120b of the second layer 100b may not affect the first layer 100a, adverse effects on a resultant pattern deposited through the mask due to welding may be minimized and the precision of the mask 100 may be improved.

The first layer 100a may have a pattern aperture corresponding to the opening portion 115 of the second layer 100b. Also, the first layer 100a may be smaller than the second layer 100b so that a portion of the second layer 100b extending beyond the first layer 100a may be welded to the frame 200. In each case, the mask 100 may include one piece or a plurality of unit mask strips (i.e., a mask having a multibody structure), which may be separable in a predetermined direction. These examples will be explained below with reference to FIGS. 5 through 13.

Figure 2:
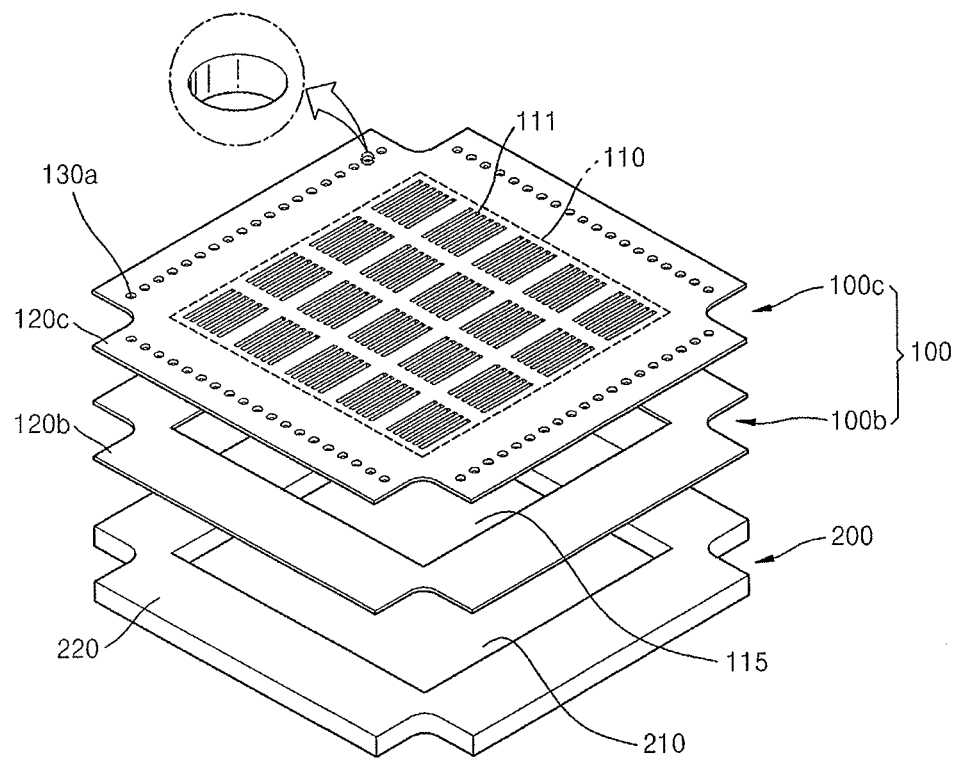
FIG. 2 illustrates an exploded perspective view of a mask frame assembly for thin film deposition, according to another embodiment.

FIG. 2 illustrates an exploded perspective view of a mask frame assembly for thin film deposition according to an embodiment. Referring to FIG. 2, first welding patterns 130a, corresponding to welding points of the second layer 100b, may be formed on a first layer 100c.

The first layer 100c may include the deposition area 110, the deposition opening portions 111 and the peripheral portion 120c. The peripheral portion 120c disposed outside the deposition area 110 may include the first welding patterns 130a, which may pass through the peripheral portion 120c in regions corresponding to welding points (not shown) where the welding portion 120b is welded to the support portion 220 of the frame 200.

Figure 3:
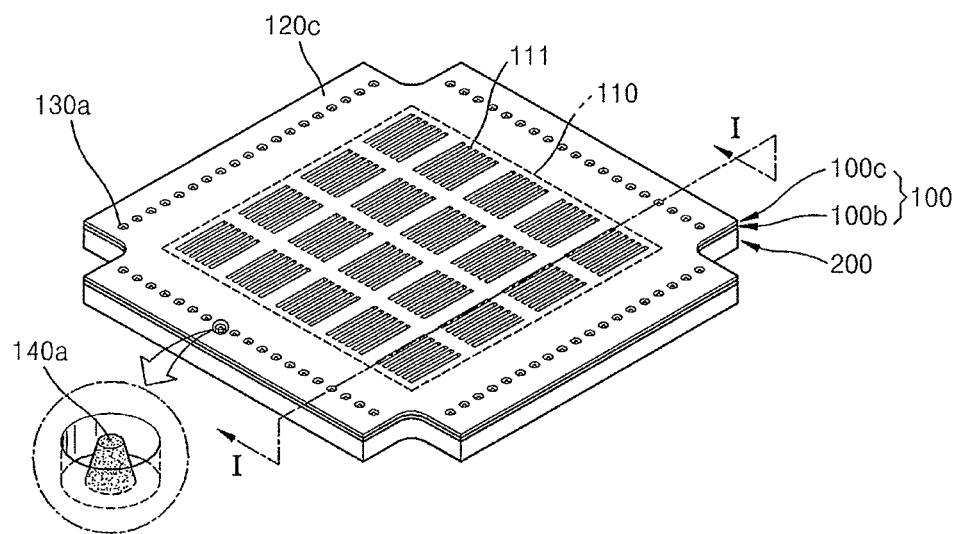
FIG. 3 illustrates an assembled perspective view of the mask frame assembly for thin film deposition of FIG. 2.
Figure 4:
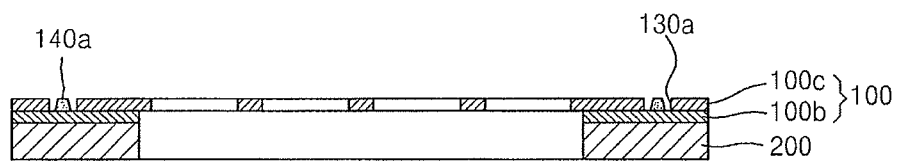
FIG. 4 illustrates a cross-sectional view taken along line I-I of FIG. 3.

FIG. 3 illustrates an assembled perspective view of the mask frame assembly for thin film deposition of FIG. 2. FIG. 4 illustrates a cross-sectional view taken along line I-I of FIG. 3.

Referring to FIGS. 3 and 4, the first welding patterns 130a may pass through the peripheral portion 120c of the first layer 100c, so that when the second layer 100b is welded to the frame 200, centers of first welding projections 140a generated on the second layer 100b may be spaced apart from edges of the first welding patterns 130a. The first welding patterns 130a may be large enough to not contact the first welding projections 140a. A height of each of the first welding projections 140a may be smaller than the thickness of the first layer 100c.

A contact portion between the second layer 100b and the first layer 100c may be disposed outside the deposition area 110 so as not to obstruct deposition. Since the first layer 100c and the second layer 100b may form the mask 100 having a two-layer structure, when the second layer 100b is welded to the frame 200, the mask 100 may thereby be fixed to the frame 200.

The first layer 100c and the second layer 100b may be manufactured separately and subsequently fixed to each other by, e.g., welding or adhesion. If the first layer 100c and the second layer 100b are manufactured separately and then welded to each other, the welding portion 120b may be disposed outside the deposition area 110 so as not to obstruct, e.g., adhesion, between the mask 100 and a large area substrate during thin film deposition.

Figure 5:
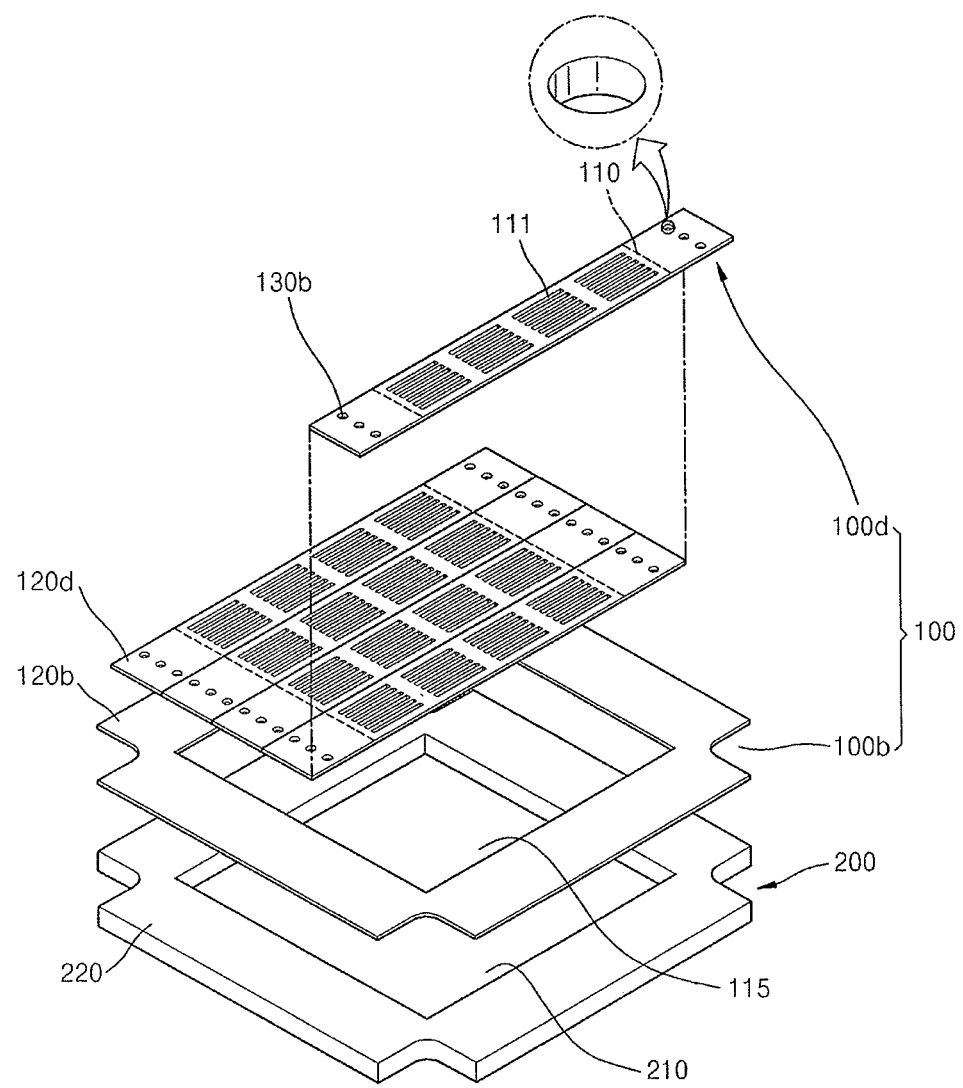
FIG. 5 illustrates an exploded perspective view of a mask frame assembly for thin film deposition, according to another embodiment.

FIG. 5 illustrates an exploded perspective view of a mask frame assembly for thin film deposition according to another embodiment. Referring to FIG. 5, the mask 100 may include second welding patterns 130b disposed on a first layer 100d that may include a plurality of unit mask strips (i.e., a mask having a multibody structure). The second welding patterns 130b may correspond to welding points (not shown) of the second layer 100b. The unit mask strips may be separable in a predetermined direction.

Figure 6:
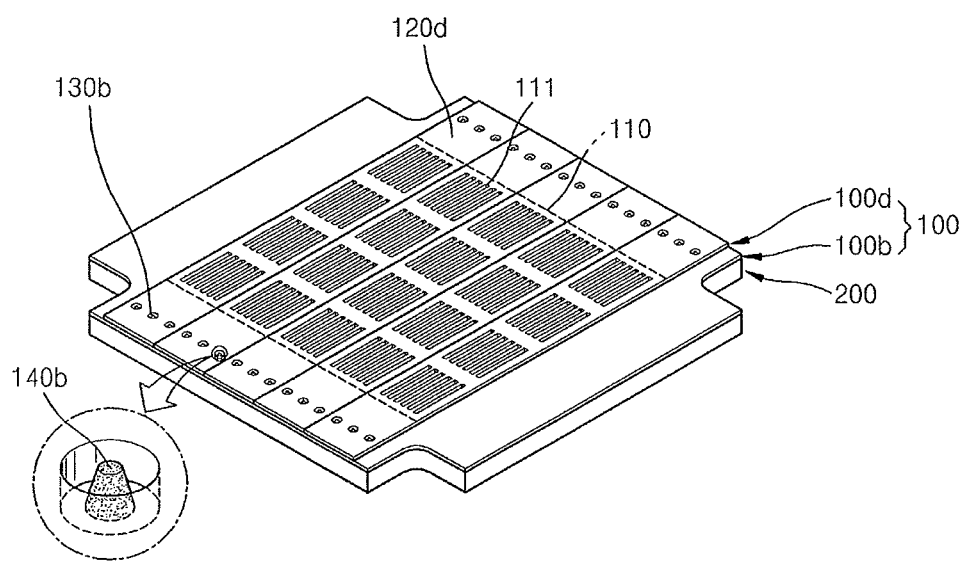
FIG. 6 illustrates an assembled perspective of the mask frame assembly for thin film deposition of FIG. 5.

FIG. 6 illustrates an assembled perspective view of the mask frame assembly for thin film deposition of FIG. 5. The first layer 100d, including the plurality of unit mask strips, may be formed by, e.g., electroplating, and may be fixed to the second layer 100b in various manners. The first layer 100d may be attached to the second layer 100b by, e.g., electric welding, laser welding or by using an adhesive. A contact portion between the first layer 100d and the second layer 100b may be disposed outside the deposition area 110. Accordingly, welding projections 140b, which may be generated when attaching the first layer 100d to the second layer 100b, may not obstruct, e.g., adhesion, between the mask 100 and a large area substrate during thin film deposition.

The second layer 100b may correspond to the frame 200. Although the frame 200 is illustrated having a unibody structure in FIG. 5, the frame 200 may include at least two parts. In addition, in an implementation, the unit mask strips may be aligned and welded to form a predetermined gap therebetween.

Figure 7:
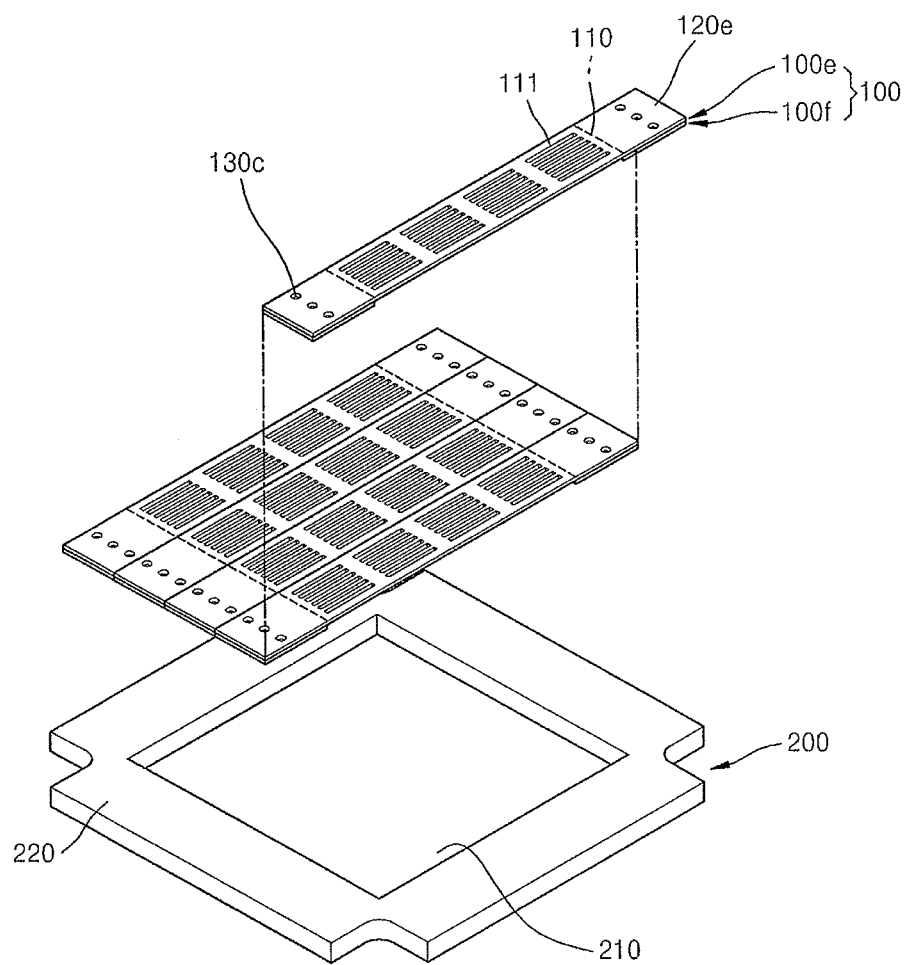
FIG. 7 illustrates an exploded perspective view of a mask frame assembly for thin film deposition, according to another embodiment.

FIG. 7 illustrates an exploded perspective view of a mask frame assembly for thin film deposition according to another embodiment. Referring to FIG. 7, the mask 100 may include a first layer 100e and a second layer 100f. The first layer 100e may include third welding patterns 130c corresponding to welding points (not shown) of the second layer 100f. The two layers 100e and 100f may include a plurality of unit mask strips (i.e., a mask having a multibody structure), which may be separable in a predetermined direction.

Although the mask 100 of FIG. 7 may have a multibody structure like the mask 100 of FIG. 5, in FIG. 7 the second layer 100f may separate along with the first layer 100e. That is, the second layer 100f may include a plurality of unit mask strips corresponding to the plurality of unit mask strips of the first layer 100e, which may be separated in a predetermined direction. The second layer 100f and the first layer 100e may thereby form a mask having multibody structure.

Since the first layer 100*e* and the second layer 100*f* may be attached to each other to form the mask 100, the first layer 100*e* may be fixed when the second layer 100*f* is welded to the frame 200. Since the first layer 100*e* may have the third welding patterns 130*c*, centers of welding projections generated on the second layer 100*f* when the second layer 100*f* is welded to the frame 200 may be spaced apart from edges of the third welding patterns 130*c*.

The first layer 100*e* and the second layer 100*f* may be formed separately and then adhered to each other in various ways. The frame 200 may have a sufficient hardness because the extended mask 100 may be supported on the frame 200.

Figure 8:
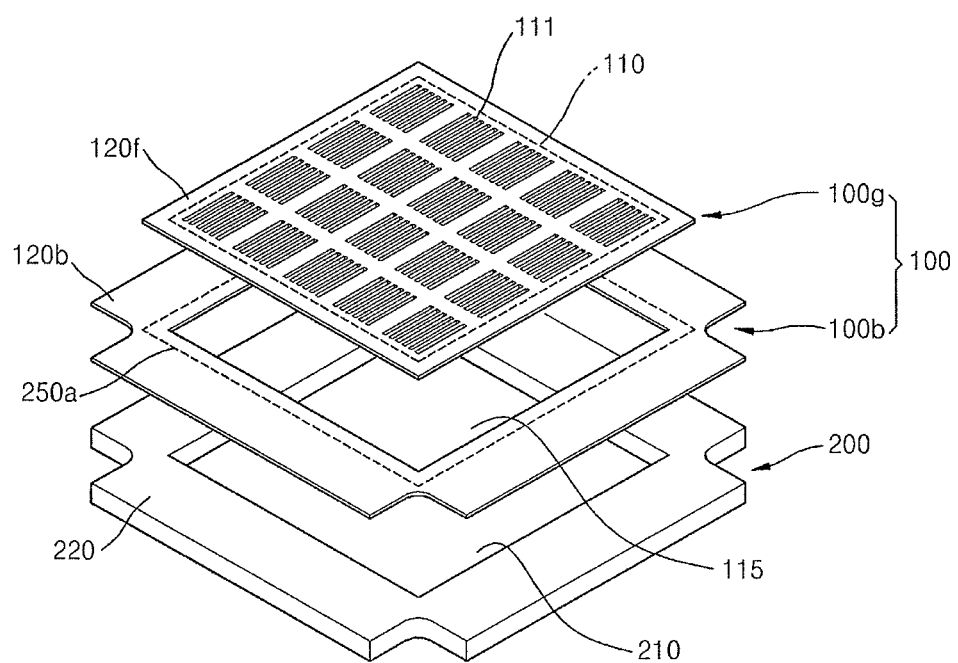
FIG. 8 illustrates an exploded perspective view of a mask frame assembly for thin film deposition, according to another embodiment.

FIG. 8 illustrates an exploded perspective view of a mask frame assembly for thin film deposition according to another embodiment. As illustrated in FIG. 8, at least a part of a first layer 100*g* may contact the second layer 100*b*. In addition, the first layer 100*g* may be smaller than the second layer 100*b*.

The first layer 100*g* may include the deposition area 110, the deposition opening portions 111 and a peripheral portion 120*f*. The second layer 100*b* may include the second layer opening portion 115 and the welding portion 120*b*. The welding portion 120*b* of the second layer 100*b* may be disposed at a position corresponding to the peripheral portion 120*f* of the first layer 100*g*. The welding portion 120*b* may extend beyond a contact portion 250*a* where the peripheral portion 120*f* attaches to the second layer 100*b*. Referring to FIG. 8, the welding portion 120*b* of the second layer 100*b* may be welded to, and formed to correspond to, the support portion 220 of the frame 200.

Figure 9:
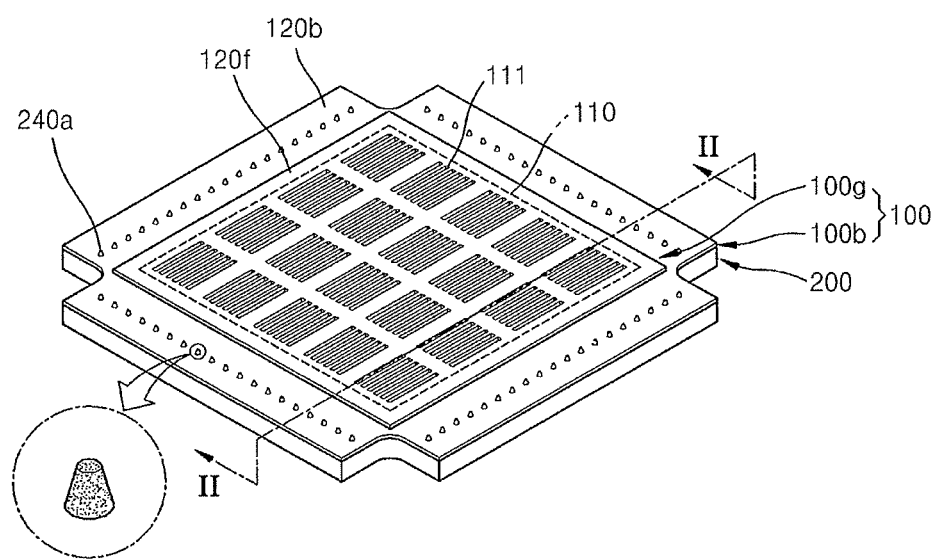
FIG. 9 illustrates an assembled perspective view of the mask frame assembly for thin film deposition of FIG. 8.
Figure 10:
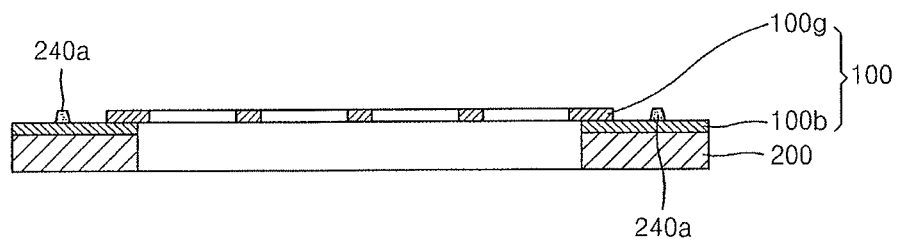
FIG. 10 illustrates a cross-sectional view taken along line II-II of FIG. 9.

FIG. 9 illustrates an assembled perspective view of the mask frame assembly for thin film deposition of FIG. 8. The mask frame assembly for thin film deposition may include the frame 200 and the mask 100. The mask 100 may include the first layer 100*g* and the second layer 100*b*. FIG. 10 illustrates a cross-sectional view taken along line II-II of FIG. 9.

Referring to FIGS. 8 through 10, the mask 100 may include the first layer 100*g* and the second layer 100*b* contacting each other. The mask 100 may be fixed to the frame 200 when the second layer 100*b* is welded to the frame 200. Where the second layer 100*b* contacts the first layer 100*g*, the second layer 100*b* may be large enough to extend beyond the peripheral portion 120*f* of the first layer 100*g* so that second welding projections 240*a*, which may be generated during welding, do not contact the first layer 100*g*. In addition, the height of each of the second welding projections 240*a* may be smaller than the thickness of the first layer 100*g*, so as not to obstruct, e.g., adhesion, between the first layer 100*g* and a large area substrate during thin film deposition. Also, the second welding projections 240*a* may be formed outside the deposition area 110, so as to also not obstruct, e.g., adhesion, between the first layer 100*g* and the large area substrate during the thin film deposition.

The first layer 100*g* and the second layer 100*b* may be formed separately and then fixed to each other by, e.g., an adhesive or by welding. The welding portion 120*b* of the second layer 100*b* may be large enough to not adversely affect the deposition area 110 of the first layer 100*g* during welding. The peripheral portion 120*f* of the first layer 100*g* may be the area that contacts the second layer 100*b*.

Figure 11:
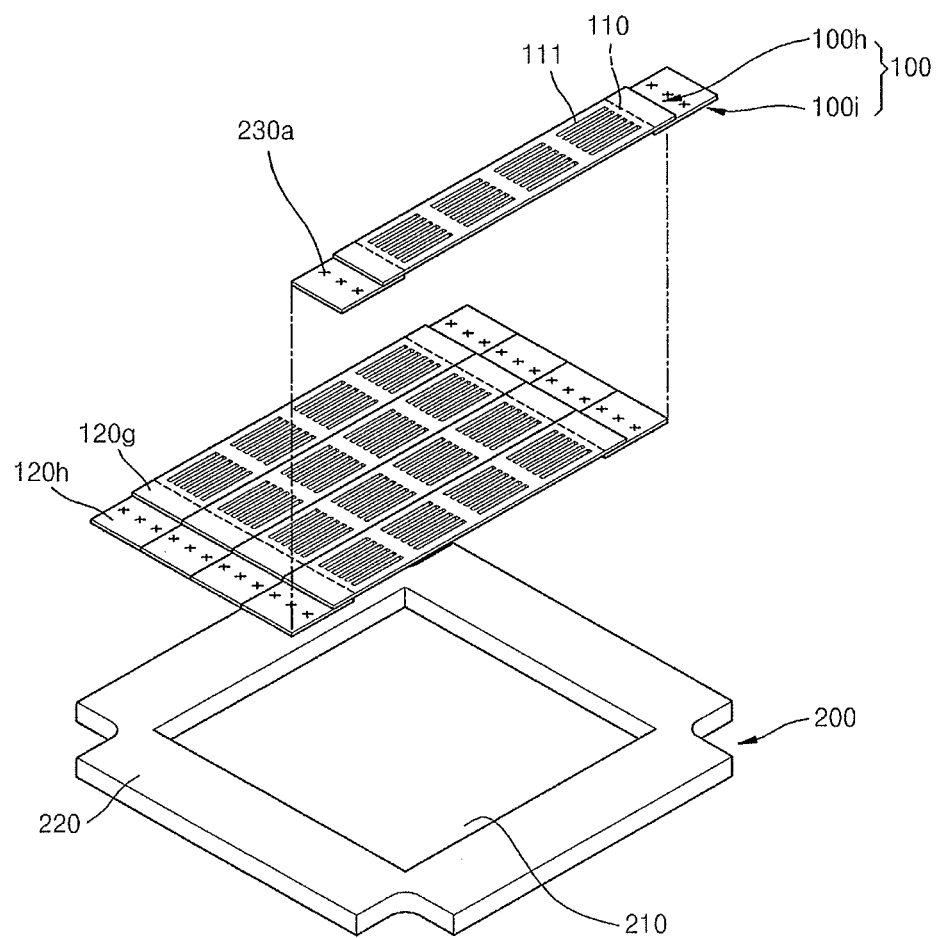
FIG. 11 illustrates an exploded perspective view of a mask frame assembly for thin film deposition, according to another embodiment.
Figure 12:
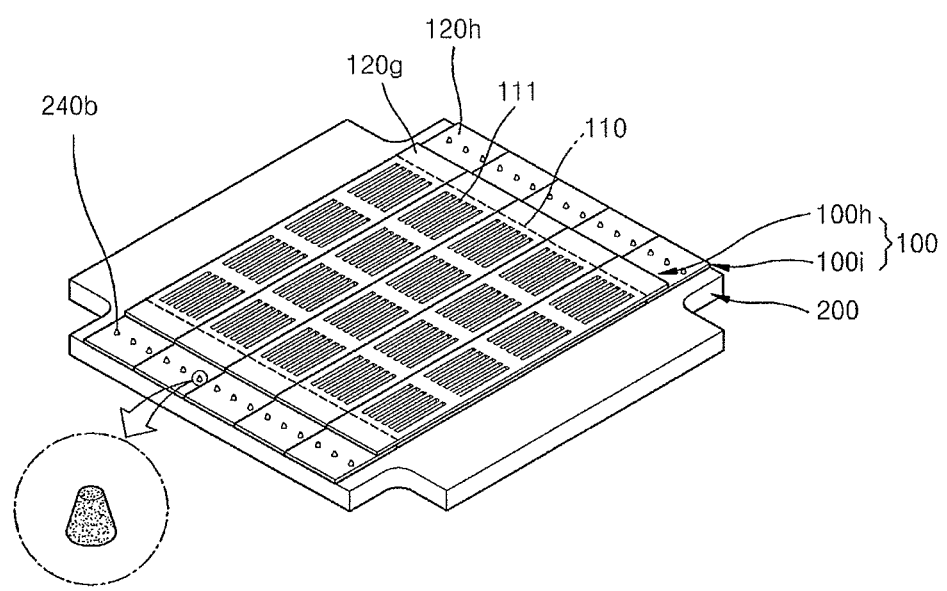
FIG. 12 illustrates an assembled perspective view of the mask frame assembly for thin film deposition of FIG. 11.

FIG. 11 illustrates an exploded perspective view of a mask frame assembly for thin film deposition according to another embodiment. FIG. 12 illustrates an assembled perspective of the mask frame assembly for thin film deposition of FIG. 11. Referring to FIGS. 11 and 12, the mask 100 may include a plurality of unit mask strips (i.e., a mask having a multibody structure) that may be separable in a predetermined direction.

A second layer 100*i* of the mask 100 may extend beyond a first layer 100*h*.

The first layer 100*h* may be formed by, e.g., an electroplating method, and may be fixed to the second layer 100*i* in various manners. The first layer 100*h* may be attached to the second layer 100*i* by, e.g., electric welding, laser welding or by using an adhesive. A contact portion between the first layer 100*h* and the second layer 100*i* may be disposed outside the deposition area 110, so that welding projections 240*b*, which may be generated during attachment of the mask 100 to the frame 200, do not obstruct adhesion between the mask 100 and a large area substrate during thin film deposition.

Welding points 230*a* of the second layer 100*i* may be welded to the support portion 220 of the frame 200. The second layer 100*i* may be large enough so that the welding projections 240*b*, may not reach the first layer 100*h*. In an implementation, the unit mask strips may be aligned and welded to form a predetermined gap therebetween.

Figure 13:
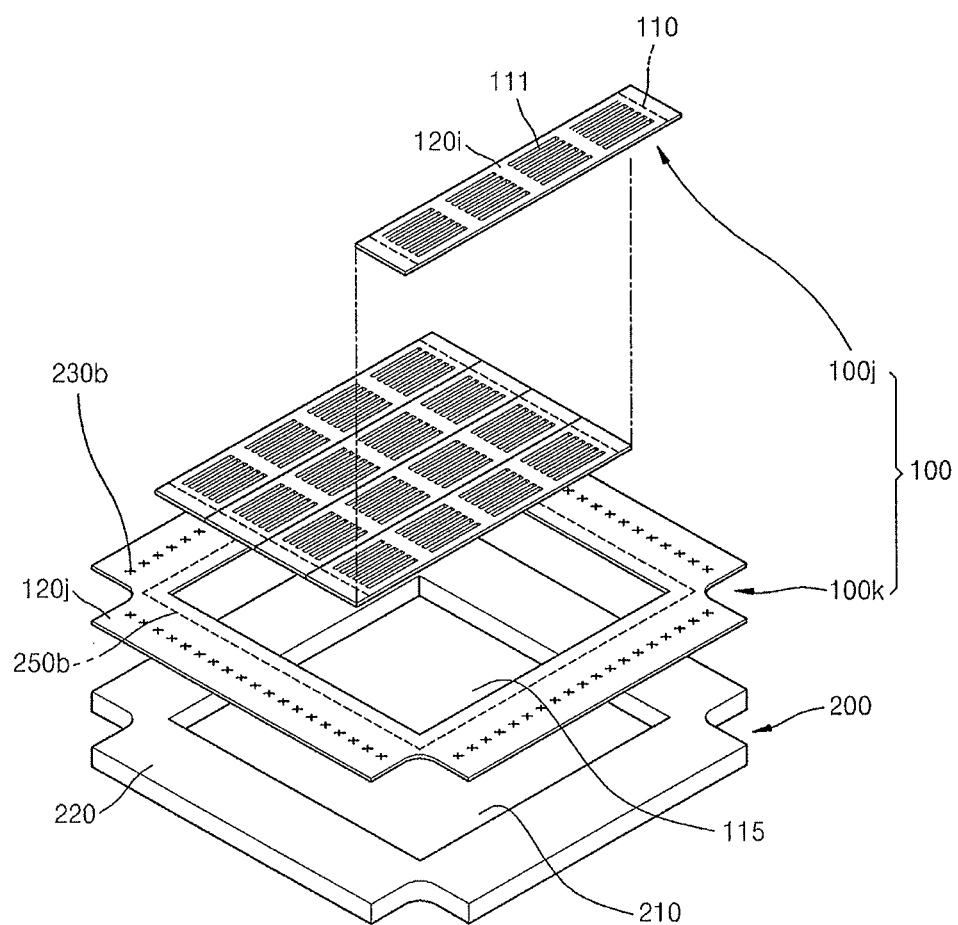
FIG. 13 illustrates an exploded perspective view of a mask frame assembly for thin film deposition, according to another embodiment.

FIG. 13 illustrates an exploded perspective view of a mask frame assembly for thin film deposition according to another embodiment. Referring to FIG. 13, the mask 100 may include unit mask strips (i.e., a mask having a multibody structure) forming a first layer 100*j* and a second layer 100*k*. The strips may be separable in a predetermined direction. Although the second layer 100*k* is illustrated as having a unibody structure in FIG. 13, the embodiments are not limited thereto, and the second layer 100*k* may include at least two parts.

The mask 100 may be formed by forming the first layer 100*j* and the second layer 100*k* separately, and then attaching the first layer 100*j* to the second layer 100*k* by, e.g., welding or adhesion. The mask 100 may be attached to the frame 200 by, e.g., welding second welding points 230*b* of the second layer 100*k*. The second welding points 230*b* may be disposed outside a contact portion 250*b* where the first layer 100*j* is attached to the second layer 100*k*, so that welding projections (not shown) generated by the welding may not contact the first layer 100*j*.

Figure 14:
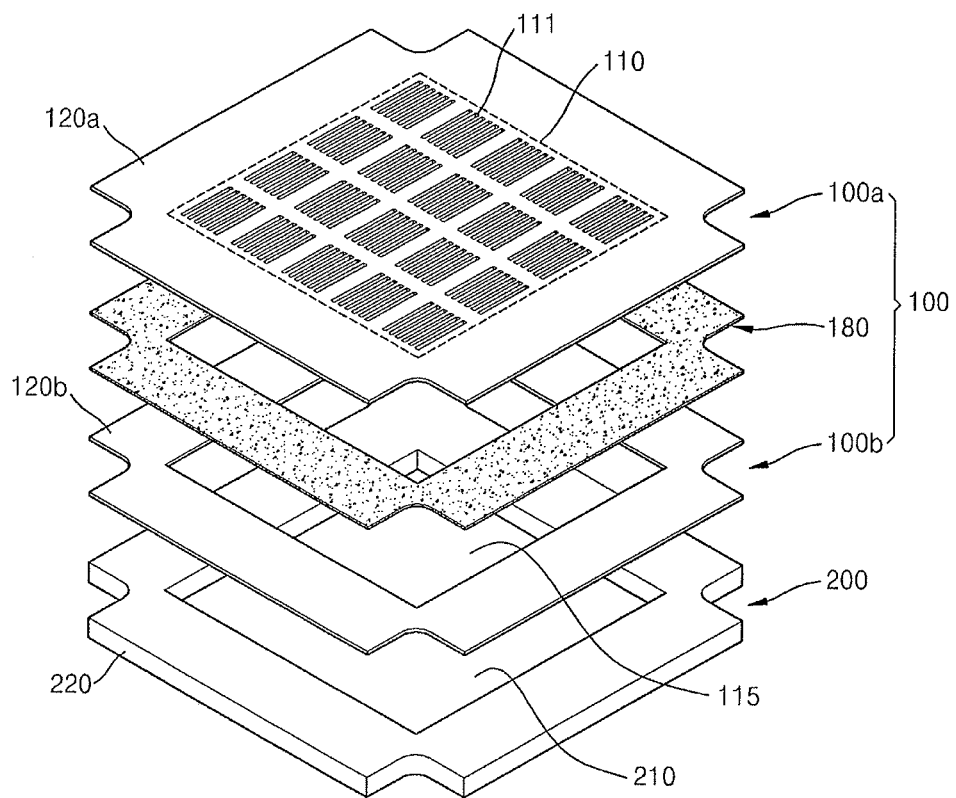
FIG. 14 illustrates an exploded perspective view of a mask frame assembly for thin film deposition, according to another embodiment.

FIG. 14 illustrates an exploded perspective view of a mask frame assembly for thin film deposition according to another embodiment. Referring to FIG. 14, an adhesive layer 180 may be disposed between the first layer 100*a* and the second layer 100*b*. As illustrated in FIG. 14, the mask 100 may be formed attaching the first layer 100*a* and the second layer 100*b* with the adhesive layer 180.

Figure 15:
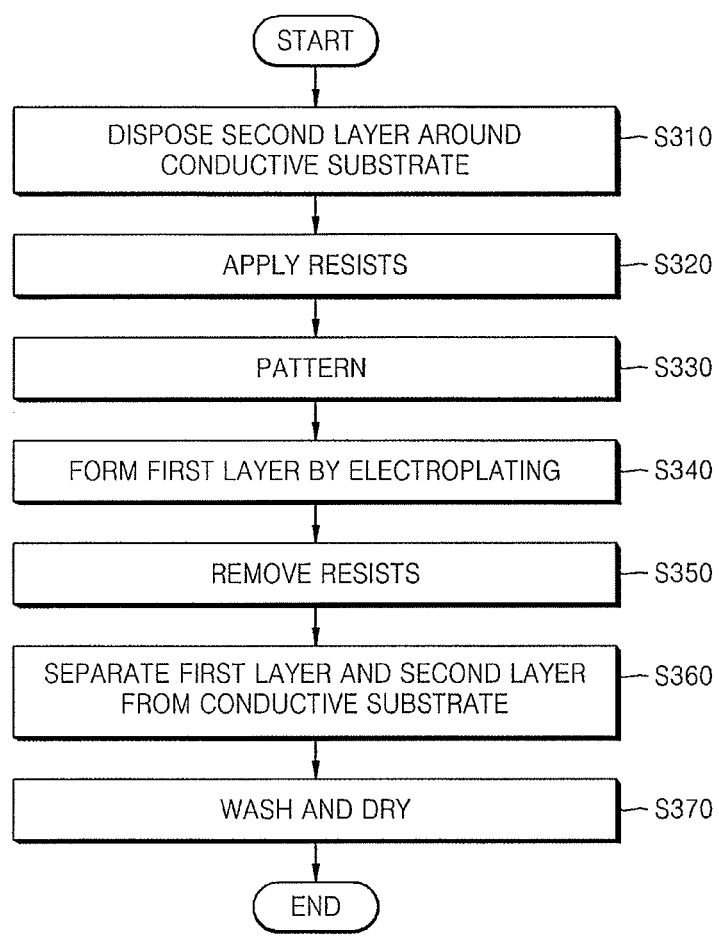
FIG. 15 illustrates a flowchart of a method of forming a mask using electroplating.
Figure 16:
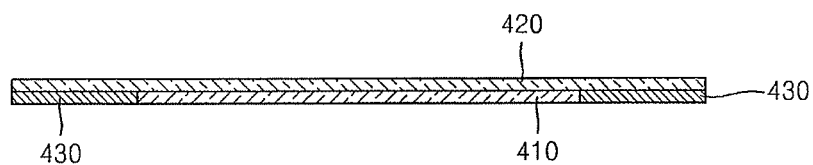
FIG. 16 illustrates cross-sectional views of a method of manufacturing a mask using electroplating, the mask having welding patterns on a first layer.
Figure 16:
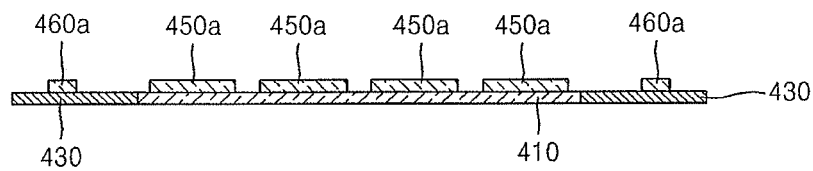
Figure 16:
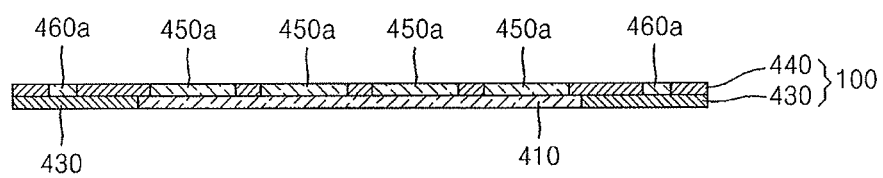
Figure 16:
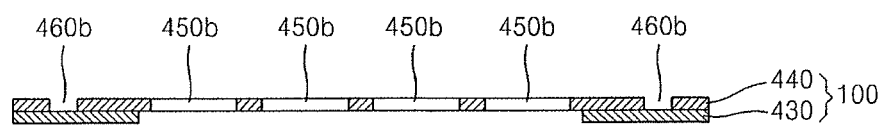

FIG. 15 illustrates a flowchart of a method of forming the mask 100 using electroplating. FIG. 16 illustrates cross-sectional views of a method of forming the mask 100 using electroplating, the mask 100 having welding patterns on the first layer. The method illustrated in FIG. 16 may be used to form the mask 100 having the welding patterns on a peripheral portion of the first layer, as illustrated in FIGS. 2 through 4 or FIG. 7.

Figure 17:
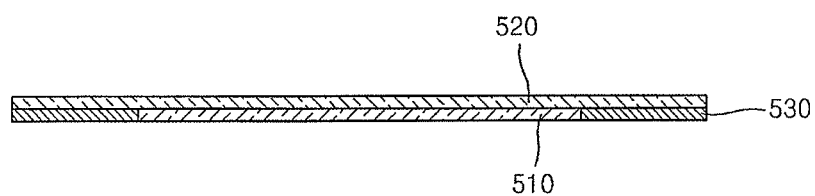
FIG. 17 illustrates cross-sectional views of a method of manufacturing a mask using electroplating, wherein at least a part of a first layer of the mask contacts a second layer.
Figure 17:
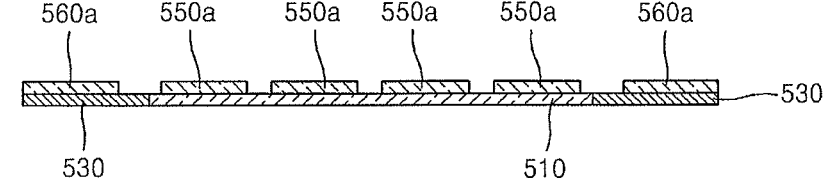
Figure 17:
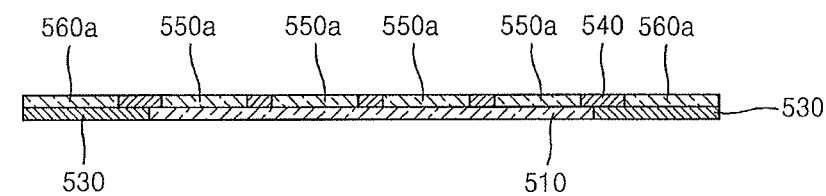
Figure 17:
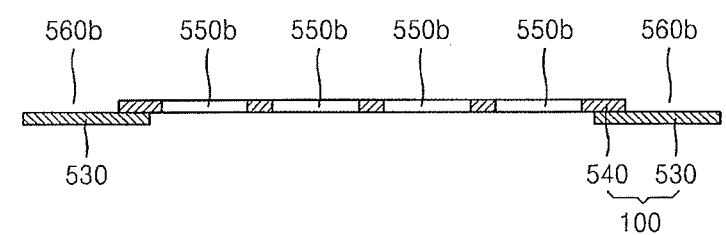

FIG. 17 illustrates cross-sectional views of a method of manufacturing the mask 100 using electroplating, wherein at least a part of the first layer of the mask 100 contacts the second layer. When the method illustrated in FIG. 17 is used to form the mask 100, at least a part of the first layer may contact the second layer, and the second layer may be large enough to extend beyond a peripheral portion of the first layer as illustrated in FIGS. 8 through 12. A method of manufacturing a mask will now be explained with reference to FIGS. 15 through 19.

Figure 18:
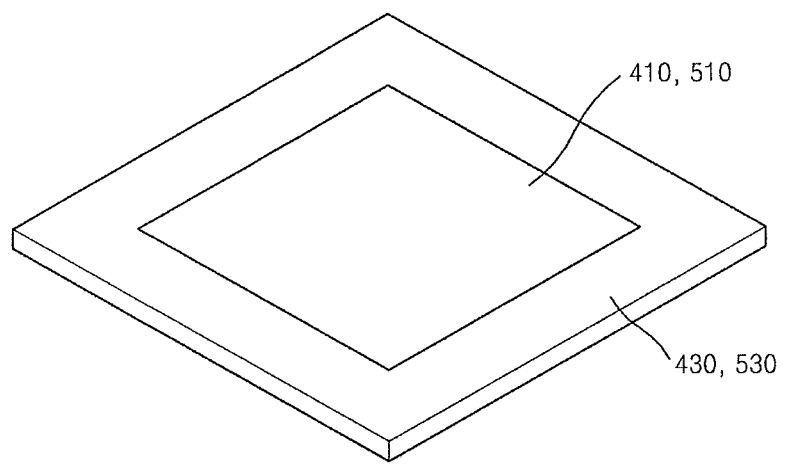
FIG. 18 illustrates a perspective view of a second layer disposed around a rectangular conductive substrate.
Figure 19:
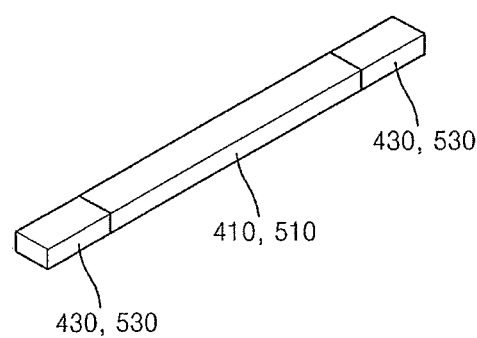
FIG. 19 illustrates a perspective view of a second layer disposed on both ends of a conductive substrate that extends in a longitudinal direction.

First, a conductive substrate 410 or 510 may be prepared. In order to manufacture a mask having a unibody structure, the conductive substrate 410 or 510 may have a substantially square shape as illustrated in FIG. 18. In order to manufacture a mask having a multibody structure, the conductive substrate 410 or 510 may have a rectangular shape that extends in a longitudinal direction as illustrated in FIG. 19.

In operation S310, a second layer 430 or 530 may be disposed so that at least a part of the conductive substrate 410 or 510 contacts at least a part of the second layer 430 or 530. When the mask has a unibody structure, the second layer 430 or 530 may be disposed around the conductive substrate 410 or 510 as illustrated in FIG. 18. Alternatively, when the mask has a multibody structure, the second layer 430 or 530 may be disposed at both ends of the conductive substrate 410 or 510 as illustrated in FIG. 19.

In operation S320, resists 420 or 520 may be applied to the conductive substrate 410 or 510 and the second layer 430 or 530 as illustrated in operation (a) of FIGS. 16 and 17. Various resists including, e.g., a dry film resist (DFR), may be applied to the conductive substrate 410 or 510 and the second layer 430 or 530.

In operation S330, patterning may be performed by exposing and/or developing the resists 420 or 520 as illustrated in operation (b) of FIGS. 16 and 17. The patterning may include forming first resist patterns 450*a* or 550*a* on the conductive substrate 410 or 510 and second resist patterns 460*a* or third resist patterns 560*a* on the second layer 430 or 530. The first resist patterns 450*a* or 550*a* may be formed on the conductive substrate 410 or 510 in various ways depending on the mask opening portions. The second pattern resists 460*a* may be formed on the second layer 430 so that centers of welding projections generated when the second layer 430 is welded to a frame may be spaced apart from welding patterns of the first layer 440. However, the third pattern resists 560*a* may be formed on the second layer 530 so that centers of welding projections generated when the second layer 530 is welded to the frame may be spaced apart from the first layer 540.

Since the centers of the welding projections may be spaced apart from the first layer 440 or 540, the welding projections may not contact, or may hardly contact, the first layer 440 or 540, and deformation of the first layer 440 or 540 due to, e.g., heat of the welding projections, may be minimized. FIGS. 20 through 23 illustrate a method of forming the second resist patterns 460*a* or the third resist patterns 560*a* on the conductive substrate 410 or 510 and the second layer 430 or 530. However, the embodiments are not limited thereto, and the method of forming the second resist patterns 460*a* or the third resist patterns 560*a*, and the shape of the second resist patterns 460*a* or the third resist patterns 560*a*, may change in various ways.

Figure 20:
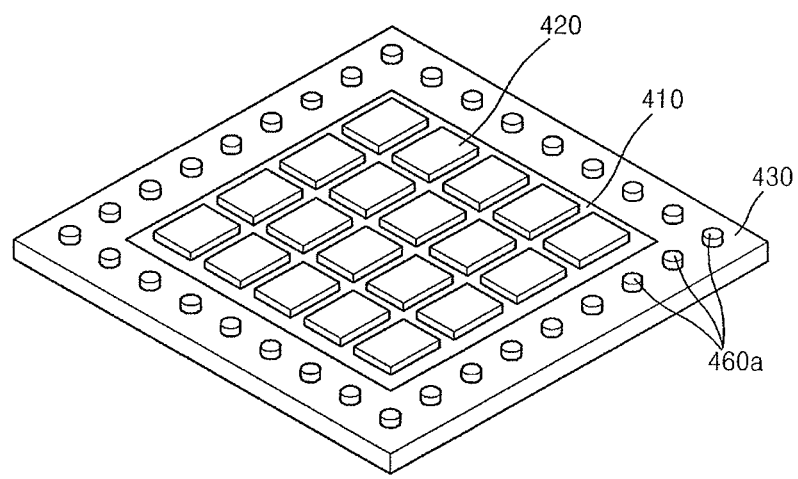
FIG. 20 illustrates a perspective view of operation (b) of the method of FIG. 16, wherein second pattern resists are formed on welding points where the second pattern resists are welded to a frame when manufacturing a mask having a one-body, i.e., unibody, structure.
Figure 21:
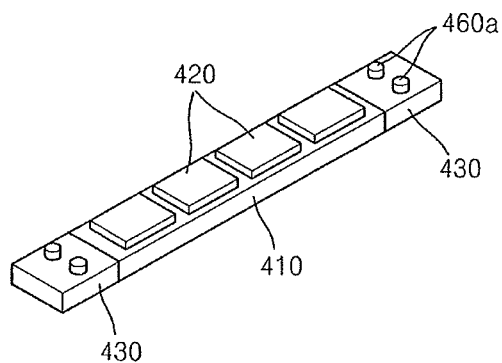
FIG. 21 illustrates a perspective view of operation (b) of the method of FIG. 16, wherein second pattern resists are formed on the welding points where the second pattern resists are welded to the frame when manufacturing a mask having a multiple-body, i.e., multibody, structure.

FIG. 20 illustrates a perspective view of the operation (b) of the method illustrated in FIG. 16 for forming a mask having a unibody structure. Referring to FIG. 20, the second resist patterns 460*a* may be formed at intended welding points of the second layer 430 where the second layer 430 will be welded to the frame. If a multibody structure mask is desired, the second pattern resists 460*a* may be formed on the second layer 430 at ends of the conductive substrate 410 extending in a longitudinal direction, referring to FIG. 21. The second resist patterns 460*a* may also be formed at the intended welding points of the second layer 430 where the second layer 430 will be welded to the frame. For example, after removing the resists during electroplating, the second pattern resists 460*a* may form the first welding patterns 130*a* or the third welding patterns 130*c* of FIGS. 2 through 4 or FIG. 7.

Figure 22:
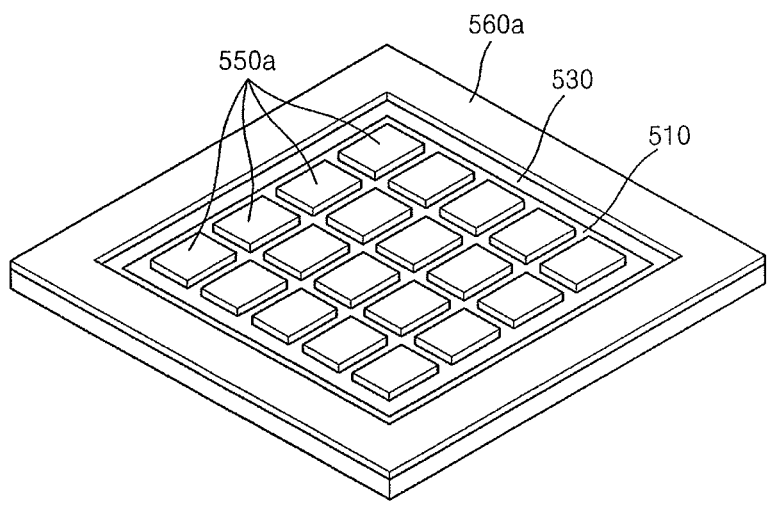
FIG. 22 illustrates a perspective view of operation (b) of the method of FIG. 17, wherein third pattern resists are formed around a second layer when manufacturing a mask having a unibody structure.
Figure 23:
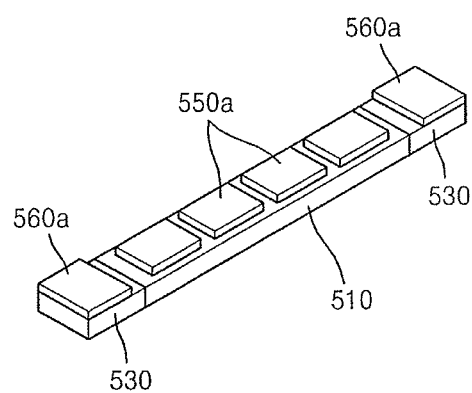
FIG. 23 illustrates a perspective view of operation (b) of the method of FIG. 17, wherein third pattern resists are formed around the second layer when manufacturing a mask having a multibody structure.

FIG. 22 illustrates a perspective view of the operation (b) of the method of FIG. 17 for forming a mask having a unibody structure. Referring to FIG. 22, the third resist patterns 560*a* may be formed on the second layer 530 along a periphery thereof. If a multibody structure mask is desired, the third resist patterns 560*a* may be formed at ends of the second layer 530, as illustrated in FIG. 23. For example, after removing the resists during electroplating, the third resist patterns 560*a* may form spaces for welding the second layer 100*b*/100*i* to the frame, which may be large enough to extend beyond the first layer 100*g* or 100*h* as illustrated in FIGS. 8 through 12. In operation S340, the first layer 440 or 540 may be formed by an electroplating method as illustrated in operation (c) of FIGS. 16 and 17.

In operation S350, the resist patterns may be removed as illustrated in operation (d) of FIGS. 16 and 17. If the first resist patterns 450*a* or 550*a* and the second resist patterns 460*a* or the third resist patterns 560*a* are removed from the first layer 440 or 540, the first patterns 450*b* or 550*b* and the second patterns 460*b* or the third patterns 560*b* may be respectively formed on the first layer 440 or 540.

For example, referring to FIG. 16, the second patterns 460*b* may be formed as the first welding patterns 130*a* of FIGS. 2 through 4, or the third welding patterns 130*c* of FIG. 7. Also, the third patterns 560*b* of FIG. 17 may form a space having a width corresponding to a distance between the periphery of the first layer 100*g* or 100*h* and an edge of the second layer as illustrated in FIGS. 8 through 12.

In operation S360, the conductive substrate 410 or 510 may be removed from the first layer 440 or 540 and the second layer 430 or 530. In operation S370, a resultant structure may be washed and dried to form a mask having a two-layered structure in which the first layer 440 or 540 and the second layer 430 or 530 may be combined to each other.

Figure 24:
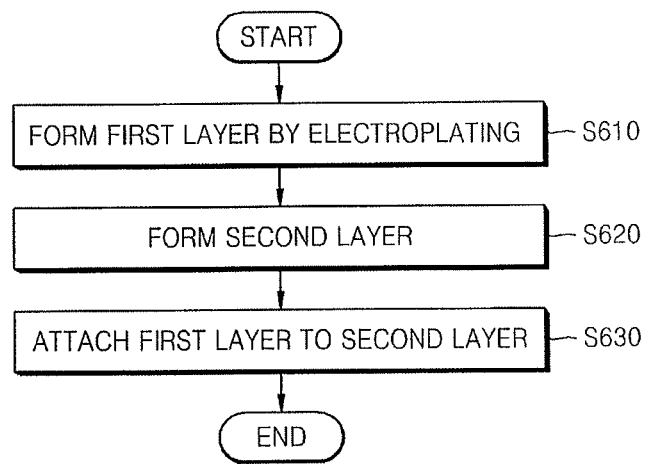
FIG. 24 illustrates a flowchart of a method of forming a mask having a two-layered structure by attaching a first layer to a second layer.

FIG. 24 illustrates a flowchart of a method of forming the mask 100 having a two-layered structure by attaching the first layer 100*a* to the second layer 100*b*. In order to manufacture the mask 100, in operation S610, the first layer 100*b* may be formed by an electroplating method. In operation S620, the second layer 100*b* may be formed separately from the first layer 100*b*. In operation S630, the first layer 100*a* and the second layer 100*b* may be attached to each other by, e.g., electric or laser welding or with an adhesive. The welding may be performed outside the deposition area 110 of the first layer 100*a*, so as not to obstruct the, e.g., adhesion, between a large area substrate and the first layer 100*a* during thin film deposition.

Figure 25:
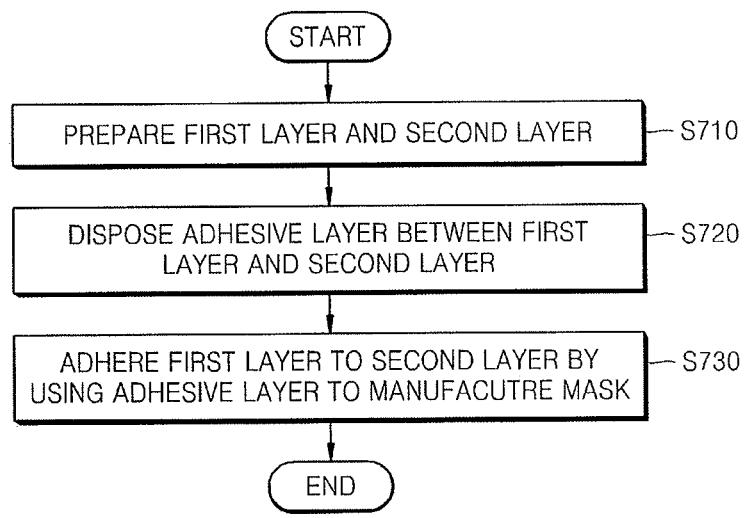
FIG. 25 illustrates a flowchart of a method of forming the mask having a two-layered structure by adhering a first layer to a second layer by using an adhesive layer.

FIG. 25 illustrates a flowchart of a method of forming the mask 100 having a two-layered structure including the first layer 100*a* and the second layer 100*b*, which may be adhered to each other with an adhesive layer. Referring to FIG. 25, in operation S710, the first layer 100*a* and the second layer 100*b* may be separately prepared. In operation S720, the adhesive layer may be interposed between the first layer 100*a* and the second layer 100*b*. In operation S730, the first layer 100*a* and the second layer 100*b* may be adhered to each other via the adhesive layer.

Figure 26:
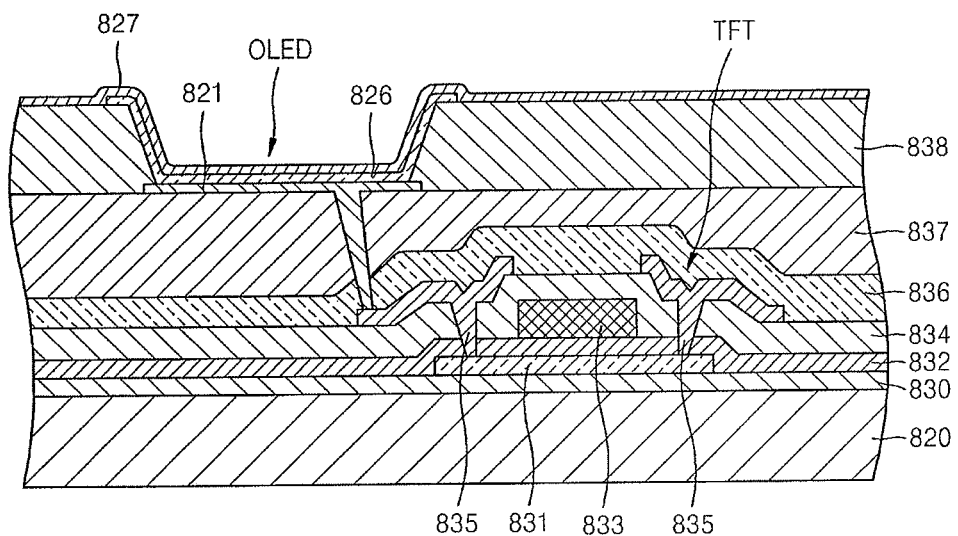
FIG. 26 illustrates a cross-sectional view of an organic light emitting display device according to an embodiment.

FIG. 26 illustrates a partial cross-sectional view of an organic light emitting display device, according to an embodiment. The organic light emitting display device of FIG. 26 may be an active matrix (AM) type, and a subpixel thereof is illustrated in FIG. 26. The subpixel may include at least one thin film transistor (TFT) and an electroluminescent (EL) element. The electroluminescent (EL) element may be a self-emissive device and may be an organic light emitting device. However, the subpixel is not limited to the structure illustrated in FIG. 26, and the number and structure of the TFTs may be modified in various ways. The organic electroluminescent display device (OLED) of FIG. 26 will now be explained in detail.

Referring to FIG. 26, a buffer layer 830 may be disposed on a substrate 820, and a TFT may be disposed on the buffer layer 830. The TFT may include a semiconductor active layer 831, a gate insulating layer 832 covering the active layer 831 and a gate electrode 833 on the gate insulating layer 832. An interlayer insulating layer 834 may cover the gate electrode 833, and source and drain electrodes 835 may be disposed on the interlayer insulating layer 834. The source and drain electrodes 835 may respectively contact a source region and a drain region of the semiconductor active layer 831 through contact holes in the interlayer insulating layer 834 and the gate insulating layer 832. The source and drain electrodes 835 may be connected to a first electrode layer 821. The first electrode layer 821 may be an anode of the OLED. The first electrode layer 821 may be disposed on a planarization layer 837, and a pixel defining layer 838 may cover the first electrode layer 821. After a predetermined opening is formed in the pixel defining layer 838, an organic layer 826 of the OLED element may be formed, and a second electrode layer 827 may be deposited on a resultant structure. The second electrode layer 827 may be a common electrode of the OLED The organic layer 826 of the OLED may include red (R), green (G) and blue (B) organic light emitting layers to create full color images. The mask frame assembly for thin film deposition including the deposition opening portions 111 that includes a masking pattern having a plurality of slits according to an embodiment may be used to improve adhesion between a large area substrate and the mask 100 and to obtain high precision patterns. Furthermore, the mask frame assembly for thin film deposition including the deposition opening portions 111 that include a masking pattern having an open front even in the second layer 827 according to an embodiment may improve adhesion between the large area substrate and the mask 100 and may obtain high precision patterns.

The organic light emitting display device according to an embodiment may be sealed to prevent penetration of, e.g., external oxygen and moisture. The embodiments are not limited to the organic light emitting display device of FIG. 26, and the structure of the organic light emitting display device may be modified in various ways.

When a mask is manufactured via an electroplating method, apertures may be formed in the mask with higher precision and a much smaller distribution than in the case when the etching method is used. Thus, the electroplating method has been used in recent years in order to realize high resolution products. However, when the electroplating method is used, since it may be difficult to form a taper angle in accordance with an incident angle of deposition, and a shadow may occur during deposition, an even thinner material should be used.

Also, unlike in the etching method, nickel may be used in the electroplating method, and thus adhesion between a mask welded to a frame may be poor. When a thin metal plate is adhered to a frame by, e.g., laser welding, the contact surface between the mask and the frame may be thermally deformed so that small welding projections of predetermined sizes may be formed on the contact surface. Thus, when the mask is aligned over a large area substrate in order to deposit, e.g., an organic light emitting material or a metal material, the welding projections may adversely affect the adhesion between the large area substrate and the mask, and low quality patterns may be formed due to the shadow.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a mask frame assembly for thin film deposition, comprising:
   preparing a frame such that the frame includes an opening portion and a support portion; and
   preparing a mask such that the mask includes a first layer including a deposition area in a position corresponding to the opening portion and a peripheral portion disposed outside the deposition area, and a second layer including a welding portion, the welding portion including two pairs of opposing sides having a first surface and a second surface opposite to each other, wherein at least a part of one of the first surfaces of the second layer contacts the peripheral portion of the first layer and at least one of the second surfaces of the second layer is welded to the support portion of the frame, wherein the first layer includes welding patterns corresponding to welding points on the welding portion of the second layer where the second layer is welded to the support portion of the frame.

2. The method as claimed in claim 1, wherein the mask includes at least two unit mask strips, each unit mask strip has opposite ends, and only the opposite ends of the unit mask strips are welded to the support portion of the frame.

3. The method as claimed in claim 2, wherein preparing the mask includes:
   preparing a conductive substrate;
   disposing the second layer on the conductive substrate such that at least a part of an end of the conductive substrate contacts the second layer;
   applying resists to the conductive substrate and the second layer;
   patterning the resists;
   forming the first layer on the conductive substrate, the resists, and the second layer by an electroplating method;
   removing the resists; and
   separating the mask including the first layer and the second layer from the conductive substrate.

4. The method as claimed in claim 3, wherein patterning the resists includes forming first patterns on the conductive substrate and forming second patterns on the second layer.

5. The method as claimed in claim 3, wherein:
   patterning the resists includes forming first patterns on the conductive substrate and forming third patterns on a periphery of the second layer, and
   at least a part of the first layer contacts the second layer.

6. The method as claimed in claim 1, wherein preparing the mask includes preparing the first layer, preparing the second layer, and adhering the first layer to the second layer.

7. The method as claimed in claim 6, wherein adhering the first layer to the second layer includes preparing an adhesive layer, and disposing the adhesive layer between the first layer and the second layer.

8. The method as claimed in claim 1, wherein the first layer and the second layer include different materials.

9. The method as claimed in claim 8, wherein the second layer includes a nickel-steel alloy.

* * * * *